United States Patent
Huang

(10) Patent No.: US 10,361,814 B2
(45) Date of Patent: Jul. 23, 2019

(54) ENCODING FOR FRAMELESS PACKET TRANSMISSIONS

(71) Applicant: Friday Harbor LLC, New York, NY (US)

(72) Inventor: Will Huang, San Diego, CA (US)

(73) Assignee: Friday Harbor LLC, New York, NY (US)

( * ) Notice: Subject to any disclaimer, the term of this patent is extended or adjusted under 35 U.S.C. 154(b) by 310 days.

(21) Appl. No.: 15/183,100

(22) Filed: Jun. 15, 2016

(65) Prior Publication Data

US 2017/0366337 A1    Dec. 21, 2017

(51) Int. Cl.
| | |
|---|---|
| *H04L 1/00* | (2006.01) |
| *H04L 29/06* | (2006.01) |
| *H03M 13/19* | (2006.01) |
| *H04L 7/04* | (2006.01) |
| *H04L 29/08* | (2006.01) |

(52) U.S. Cl.
CPC .......... *H04L 1/0061* (2013.01); *H03M 13/19* (2013.01); *H04L 7/041* (2013.01); *H04L 69/22* (2013.01); *H04L 69/323* (2013.01); *H04L 69/324* (2013.01); *H04L 7/042* (2013.01); *H04L 2007/045* (2013.01)

(58) Field of Classification Search
CPC ..... H04L 1/0061; H04L 1/0078; H04L 7/042; H04L 69/22; H04L 2007/045
See application file for complete search history.

(56) References Cited

U.S. PATENT DOCUMENTS

| | | | | |
|---|---|---|---|---|
| 5,182,749 A * | 1/1993 | Kazecki | ............... | H04L 7/0062 370/498 |
| 5,517,250 A * | 5/1996 | Hoogenboom | ...... | H04N 21/236 348/390.1 |
| 8,413,006 B1 * | 4/2013 | Mok | .................... | H04L 5/0091 370/252 |
| 8,848,526 B1 * | 9/2014 | Channabasappa | ......................... | H04L 12/6418 370/230.1 |
| 9,154,454 B1 * | 10/2015 | Kumar | ................ | H04L 49/9057 |
| 2002/0075904 A1 * | 6/2002 | Dabak | ................... | H04L 1/0078 370/510 |
| 2002/0181606 A1 * | 12/2002 | De Bont | .......... | G11B 20/10527 375/295 |
| 2004/0122864 A1 * | 6/2004 | Silagi | ................... | H04N 21/235 |
| 2004/0165666 A1 * | 8/2004 | Kubo | ................... | H04N 5/4401 375/240.28 |
| 2004/0258185 A1 * | 12/2004 | Kihara | ................ | H04B 1/1027 375/371 |

(Continued)

*Primary Examiner* — Tejis Daya
(74) *Attorney, Agent, or Firm* — Sheppard Mullin Richter & Hampton LLP

(57) ABSTRACT

Methods, systems, and apparatus, including computer programs encoded on computer storage media, for encoding frameless packets. One of the methods includes receiving a data payload to be transmitted. The data payload is partitioned into multiple payload words, each payload word being of a predetermined size. A first sync word is added to each of the multiple payload words. A control word comprising label and an error checking value is added. A second sync word is added to the label and error checking word. If one or more counter criteria are satisfied while transmitting the multiple payload words, an idle word is transmitted before transmitting the label and error checking word.

22 Claims, 6 Drawing Sheets

(56) References Cited

U.S. PATENT DOCUMENTS

| | | | |
|---|---|---|---|
| 2005/0058126 A1* | 3/2005 | Zettwoch | H04L 12/433 370/375 |
| 2009/0116814 A1* | 5/2009 | Morohashi | H04N 5/92 386/248 |
| 2013/0329558 A1* | 12/2013 | Kucharewski | H04L 47/22 370/235 |
| 2014/0189459 A1* | 7/2014 | Vijayaraghavan | H03M 13/353 714/755 |
| 2015/0135041 A1* | 5/2015 | O'Connell | H04L 1/0041 714/776 |

* cited by examiner

ENCODING FOR FRAMELESS PACKET TRANSMISSIONS

BACKGROUND

This specification relates to network interface devices.

The physical layer of conventional network protocol stacks include components that serialize and deserialize bit streams, scramble and descramble data, and perform synchronization to align the data to word boundaries.

For example, the IEEE 802.3 Ethernet standard defines a Physical Coding Sublayer (PCS) that lies between the physical layer (PHY) and the media access control (MAC) layer.

On the transmitting side, a user application provides a data packet to be transmitted to the MAC layer. The MAC layer generates an Ethernet frame by adding additional words to surround the data packet to be transmitted, including start and end of packet delimiters as well as a MAC header and a cyclic redundancy check (CRC) field. The Ethernet frame is one type of Ethernet packet.

The PCS sublayer receives, from the MAC layer, the data packet and the additional words generated by the MAC layer. The PCS sublayer checks for valid framing, encodes PCS framing delimiters, adds sync words, and optionally scrambles the data in order to provide the PHY layer with a good ratio of ones to zeros.

The PCS sublayer also adds synchronization words, or for brevity, sync words, to each word of the scrambled data. The corresponding PCS sublayer on the receiving side uses the sync words to ensure that the communication is synchronized. A common synchronization line encoding is a 66/64 encoding in which a sync word of 2 bits is added to every 64-bit word to be transmitted. The sync words "01" and "10" are commonly used. The sync words "11" and "00" are not used. If either is received, the receiving device signals an error.

The PCS sublayer then provides the result to the PHY layer to be transmitted, typically through one or more other sublayers, e.g., through a Physical Medium Attachment (PMA) layer.

Instead of an Ethernet frame, an Ethernet packet can also include a control flow message that the devices can use to coordinate communications.

Either the MAC layer, or the PCS layer, or both also add, between each distinct packet, an interpacket gap. The interpacket gap is a period that the PCS sublayer uses to properly space out delimiters. The bits sent during this period are meaningless, but typically have a substantially even ratio of zeroes and ones due to the scrambling operations of the PCS sublayer. This results in high probability of a substantially 50% ratio of zeros to ones during the interpacket gap. This property allows the PHY layer to maintain DC balance and allows the communicating devices to recover the clock if necessary.

FIG. 1A illustrates the segments of two prior art Ethernet packets. The first packet 101 is an Ethernet frame, which includes a payload 113 of N octets surrounded by a preamble 110, a start-of-frame delimiter 111, and a MAC Header 112 in front of the payload 113; and a cyclic redundancy check value (CRC) 114 after the payload 113. The MAC Header 112 includes up to 18 octets of data, which can include a MAC source address, a MAC destination address, optionally a tag, and a length. The second packet is a control and status message 117.

FIG. 1B illustrates segments processed by a prior art PCS layer. The Ethernet packets 101 and 117 are typically generated by the MAC layer and provided to the PCS layer to be transmitted. When these two Ethernet packets 101 and 117 are received by the PCS layer, the PCS layer checks for proper idle and control words and then encodes the frame by adding various segments that will aid the receiving device in interpreting the received data. The PCS layer will add a PCS idle word 102 and a PCS start-of-packet delimiter 103 before the Ethernet frame 101 and will add a PCS end-of-packet delimiter 104 after the Ethernet frame 101. Similarly, the PCS layer will also encode a control and status message 117 with a proper PCS delimiter to denote the type of message and distinguish it from a data packet. When no packet is needed, the MAC layer sends idle control words, which the PCS layer encodes as idle words that make up the interpacket gaps 116 and 118.

When the Ethernet packets 101 and 117 are transmitted, the PCS sublayer will encode the data, e.g., data words, control messages, or idle words, using an appropriate line encoding, e.g., 66/64 encoding, in which the various segments of the Ethernet packet are broken up at or padded to 64-bit word boundaries and encoded for transmission with 2-bit sync words.

SUMMARY

This specification describes an encoding system for frameless packet transmissions. In frameless packet transmissions, data words are encoded with sync words. The system uses the sync word transitions rather than delimiters in order to correctly interpret received words as data words or control words. Thus, the overhead of some segments of traditional Ethernet frames can be removed.

In general, one innovative aspect of the subject matter described in this specification can be embodied in methods that include the actions of receiving a data payload to be transmitted; partitioning the data payload into multiple payload words, each payload word being of a predetermined size; adding a first sync word to each of the multiple payload words; generating a control word comprising label and an error checking value; adding a second sync word to the label and error checking word; while transmitting, to a destination device, the multiple payload words and the label and error checking word, determining that one or more counter criteria are satisfied; in response to determining that one or more counter criteria are satisfied, generating an idle word having the second sync word; and transmitting, to the destination device, the idle word before transmitting the label and error checking word to the destination device. Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. Transmitting, to the destination device, the multiple payload words comprises transmitting the multiple payload words without generating a media access control header for the data payload. Transmitting, to the destination device, the multiple payload words comprises transmitting the multiple payload words without generating a start-of-packet or an end-of-packet delimiter for the data payload. The idle word has a reserved idle keyword, and wherein generating the label and error checking word comprises generating the label to have at least a minimum Hamming distance from the idle keyword. The actions include receiving a control message to be transmitted; determining a position, in an order of control messages, of the received control message; generating one or more control words including inserting a control word representing the control message at the determined position in the ordering of the control messages, wherein each control word has the second sync word; and transmitting the one or more control words in the order of the control messages. The actions include generating the control messages to be different from the idle keyword. Each position in the ordering of the control messages represents a different control message. Generating the one or more control words comprises generating a particular control word corresponding to a particular control message, including generating enough initial control words so that the particular control word occurs, in a sequence of transmitted control words, at a position corresponding to the position in the ordering of control messages. Determining that one or more counter criteria are satisfied comprises maintaining a counter of high or low bits transmitted since a last idle word was transmitted; and determining that the counter indicates that another idle word should be sent to maintain a particular DC offset. Transmitting, to the destination device, the idle word comprises transmitting the idle word before transmitting a last payload word of the multiple payload words. Partitioning the data payload comprises partitioning data in the data payload along word boundaries and padding a last payload word to extend to an end of a last word boundary.

Particular embodiments of the subject matter described in this specification can be implemented so as to realize one or more of the following potential advantages. Frameless packet transmissions reduce latency and overhead of network communications. A system can actively monitor the DC balance of the PHY layer and insert idle words as appropriate.

Details of one or more embodiments of the subject matter of this specification are set forth in the accompanying drawings and the description below. Other features, aspects, and potential advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes a system that can reduce latency of network communications by using a line encoding to achieve frameless packet transmissions. The encoding uses the bits of the sync words to do much of the work previously done by PCS layers, MAC layers, or both. By doing so, the system can effectively merge one or more layers of the network protocol stack and in doing so, eliminate several data segments that are unnecessary.

In this specification, a line encoding means an encoding process used by coordinating sending and receiving devices that add a synchronization word to each word to be transmitted. In other words, when an application on a sending device provides a word to be transmitted to a receiving device, a network interface of the sending device will add a sync word to the beginning of word and transmit both the sync word and the word received from the application. The receiving device will use the sync word to verify synchronization between the devices. The receiving device will then discard the sync word and pass the remainder of the word to higher layers of the protocol stack. For clarity of explanation, the examples below will use an example 66/64 line encoding. However, the same techniques can also be applied to any other appropriate line encoding that adds sync words to each word to be transmitted. For example, systems using other line encodings, e.g., an 8/10 encoding, a 128/130 encoding, a 258/256 encoding, a 514/512 encoding, or a 1026/1024 encoding, can also use the techniques described below to achieve frameless packet transmissions.

Figure 1A:
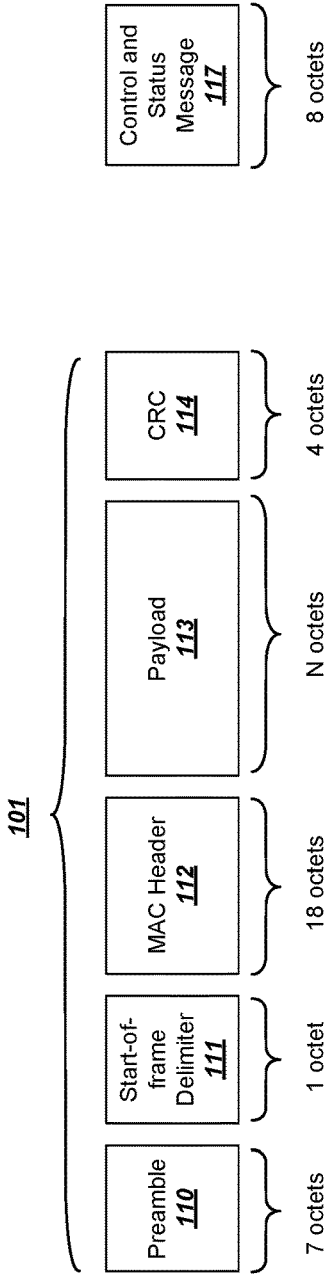
FIG. 1A illustrates the segments of two prior art Ethernet packets.
Figure 1B:
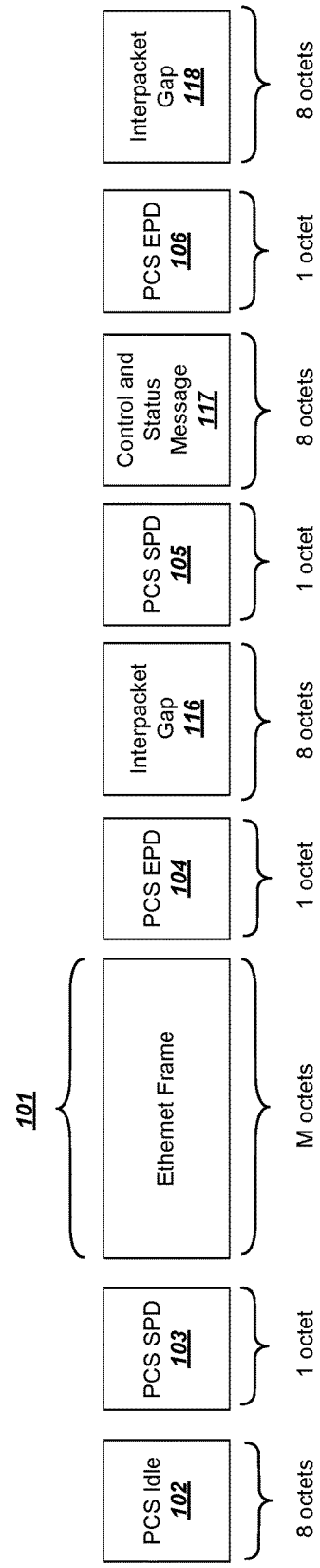
FIG. 1B illustrates segments processed by a prior art PCS layer.
Figure 1C:
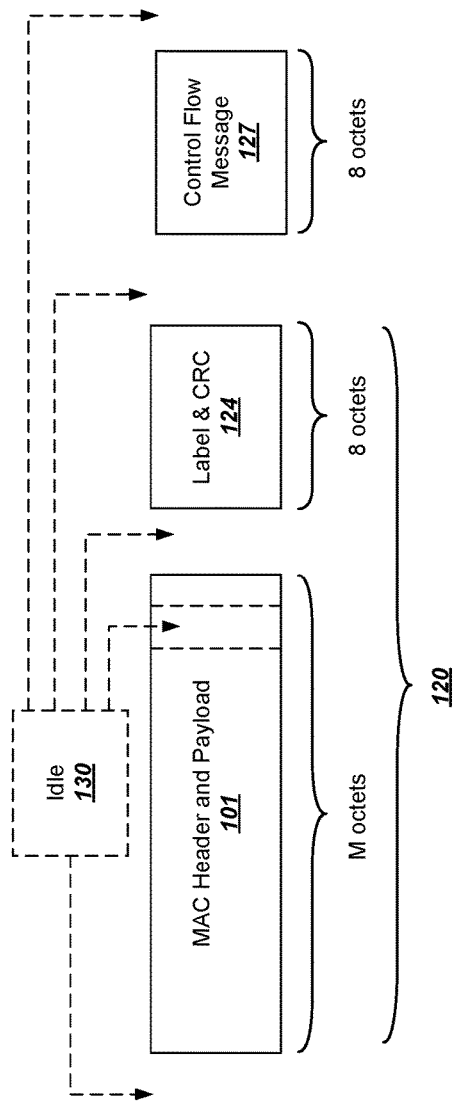
FIGS. 1C-D illustrate the segments of two packets using an encoding for frameless packet transmissions.

FIG. 1C illustrates the segments of two packets using an encoding for frameless packet transmissions. The first packet 120 includes portions of the Ethernet frame 101 in the example of FIG. 1A, in particular, the MAC header and the payload. The first packet 120 also includes a label and CRC word 124. In this example, the CRC 114 that was part of the Ethernet frame is now part of the label and CRC word 124.

The first packet 120 is a "frameless" packet in the sense that it lacks the framing segments that are added by conventional MAC and PCS layers. For example, the first packet 120 lacks a PCS start-of-packet delimiter and a PCS end-of-packet delimiter that were present in the FIG. 1B.

The second packet is a control flow message 127, which sending and receiving devices can use to coordinate communications. The second packet also lacks a PCS start-of-packet delimiter and a PCS end-of-packet delimiter or any PCS ordered set words that were present in FIG. 1B.

In addition, notably there are no mandatory interpacket gaps between the first packet 120 and the second packet 127 because there are no code words to be processed, and the spacing between such code words is not required. Instead, the sending device uses an idle word 130, which helps to maintain DC balance at the PHY layer and to also provide recovering clock compensation.

The sending device can optionally insert an idle word 130 at any arbitrary location in the sequence of words. For example, the idle word 130 can optionally be inserted before the Ethernet frame 101, between the Ethernet frame 101 and the label and CRC word 124, between the label and CRC word 124 and the control flow message 127, after the control flow message 127, or any combination of one or more of these possibilities. In addition, the idle word 130 can even be optionally inserted in the middle of the Ethernet frame 101. In other words, the first packet 120 may or may not have any idle words, and there may or may not be idle words 130 between the label and CRC word 124 and the control flow message 127.

With this frameless encoding, there are no start-of-packet or end-of-packet delimiters. Instead, a system can use sync word transitions to detect the beginning and end of a payload. In other words, an initial sync word transition, e.g., from a first sync word to a second sync word, signals the start of a data payload. And a subsequent sync word transition, e.g., from a second sync word back to the first sync word, signals the end of the data payload. Thus, the system can encode data words with one sync word, e.g., "01," and all other words, including control messages and idle words, with a different sync word, e.g., "10." The first sync word will thus be referred to as a data sync word, and the second sync word will be referred to as a control sync word.

The communicating devices can also distinguish the idle word 130 from other words having the control sync word by encoding a specially reserved idle keyword into the idle word. In some implementations, the communicating devices ensure that the idle keyword always has a minimum Hamming distance with any other keyword being used in any control flow message or any label that appears in a label and CRC word.

Figure 1D:
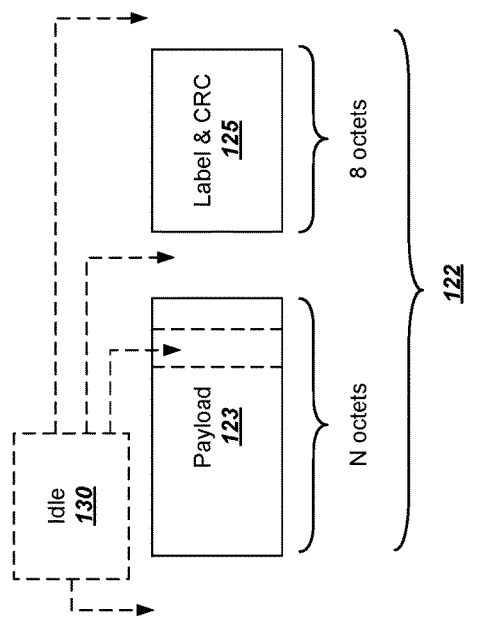

FIG. 1D illustrates segments of two packets 122 and 127 using another encoding for frameless packet transmissions. The first packet 122 is "frameless" in the sense that it also lacks segments of conventional Ethernet frames. For example, the first packet 122 lacks a preamble, a start-of-frame delimiter, and a MAC header that were present in the Ethernet frame of FIG. 1A. Instead, the first packet 122 has only the original payload 123 and a label & CRC word 125. In addition, the system lacks control flow messages in this example.

The CRC of the label & CRC word 125 can be the same as used in the Ethernet standard. The label can be a packet identifier or a packet identifier plus source or destination information, e.g., a condensed MAC header.

Thus, by using a frameless packet transmission encoding, a system can eliminate much of the latency and overhead associated with conventional Ethernet frames. This can be most beneficial when the size of the payload is small relative to the rest of the Ethernet frame. For example, in communications between some microcontrollers, the payload sizes are as small as 8 bytes. When using frameless packet transmissions, the microcontrollers can communicate payloads back and forth without the overhead of interpacket gaps.

Figure 2:
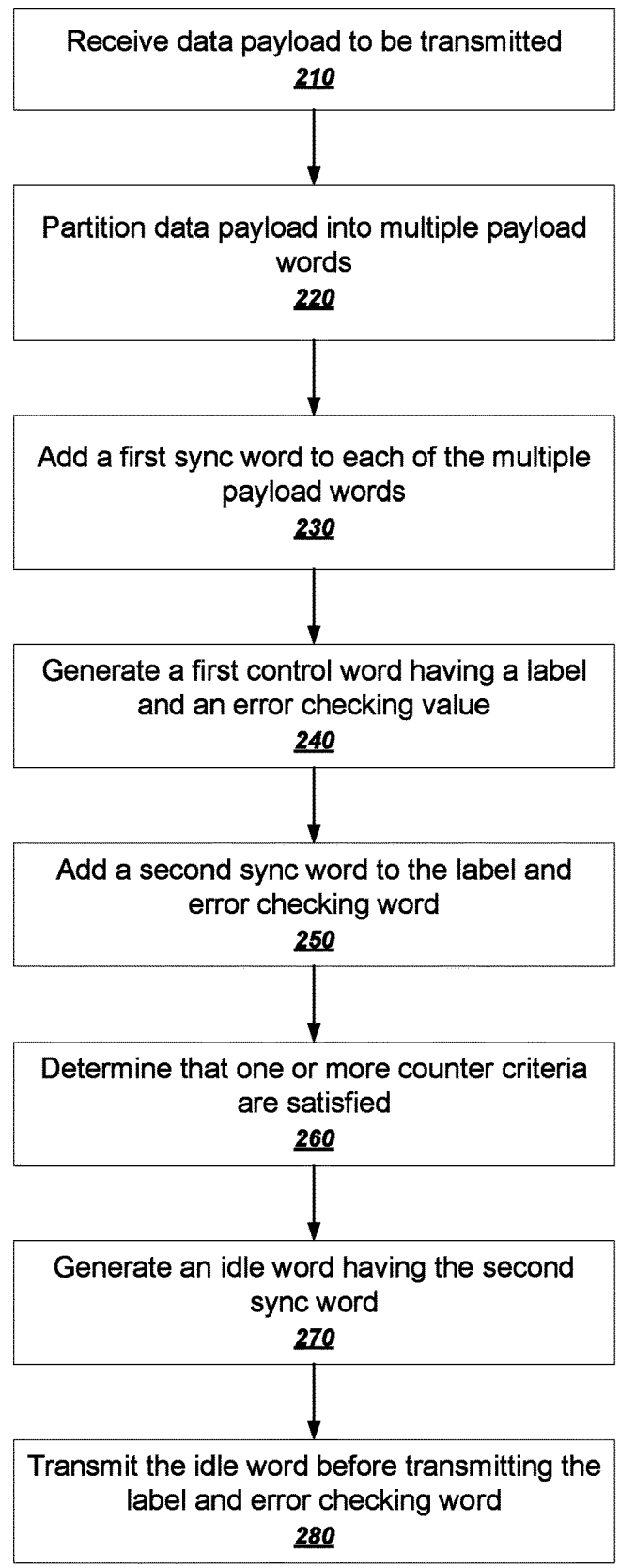
FIG. 2 is a flow chart for an example process for transmitting a frameless packet.

FIG. 2 is a flow chart for an example process for transmitting a frameless packet. The process can be performed by an appropriately programmed network interface device, e.g., as implemented in the PCS sublayer of an Ethernet interface. The process will be described as being performed by a computer system having such an appropriately programmed network interface device.

The system receives a data payload to be transmitted (210). The data payload represents data received from a particular application. The data payload is typically received from a component at a higher layer in the network protocol stack.

The system partitions the data payload into multiple payload words (220). Each payload word has a predetermined size. In some implementations, the system pads the payload words so that they conform to the predetermined size. The predetermined size can be a size divisible by the line coding width, e.g., 64 bits when using 64/66 encoding. For example, the system can partition the payload words into the predetermined size and then pad the last payload word to be the predetermined size.

The system adds a first sync word to each of the multiple payload words (230). In other words, each of the multiple payload words is extended with a same data sync word.

The system generates a first control word having a label and an error checking value (240). In general, the first control word after the data payload has a label and an error checking value. The system can assign any arbitrary value to the label. The label can include packet information, e.g., a packet identifier or source or destination information. In some implementations, the system ensures that the label has a minimum distance from the idle keyword. In this specification, a distance between words refers to a metric that quantifies how different two words are. The system can use any appropriate distance metric, e.g., a Hamming distance that measures the number of corresponding positions that differ.

The system can use any appropriate error checking value for the first control word, e.g. a standard Ethernet CRC value.

The system adds a second sync word to the control word (250). The second sync word is distinct from the first sync word. In some implementations, the second sync word has a maximum distance from the first sync word. For example, if the first sync word is "01," the system can use "10" as the second sync word.

The system determines that one or more counter criteria are satisfied (260). The system can maintain one or more counters that quantify how many high and low bits, e.g., 1's and 0's, that have been sent since last idle word was sent. If certain counter criteria are satisfied, the system can insert an idle word into the transmission in order to rebalance and recover the PHY layer.

The system can insert the idle word at any position within the transmission. Thus, before or while transmitting the payload words and the label and error checking word to a destination device, the system can determine that the one or more counter criteria have been met by the counter.

For example, the counter can measure a raw count of clock cycles, high bits, low bits, or total bits transmitted since a last idle word was sent. The system can then determine that the counter criteria are satisfied when one or more of the raw counts exceeds a threshold.

As another example, the system can use the counter to compute a measure a ratio of high bits versus low bits transmitted since a last idle word was sent. If the ratio satisfies a threshold, the system can consider the counter criteria to have been satisfied. For example, if the ratio ever drifts more than 10% away from 50%, the system can determine that the counter criteria are satisfied.

The system generates an idle word having the second sync word (270). The counter criteria being satisfied indicates that the system should send an idle word. Thus, the system generates an idle word at an appropriate location. As described above, the idle word can be inserted at any appropriate location within the data words or between the data words and the label and error checking word.

The system transmits, to the destination device, the idle word before transmitting the label and error checking word to the destination device (280). In other words, the system can insert an idle word at some location before the label and error checking word, e.g., in between the data packets being sent to the destination device.

Figure 3:
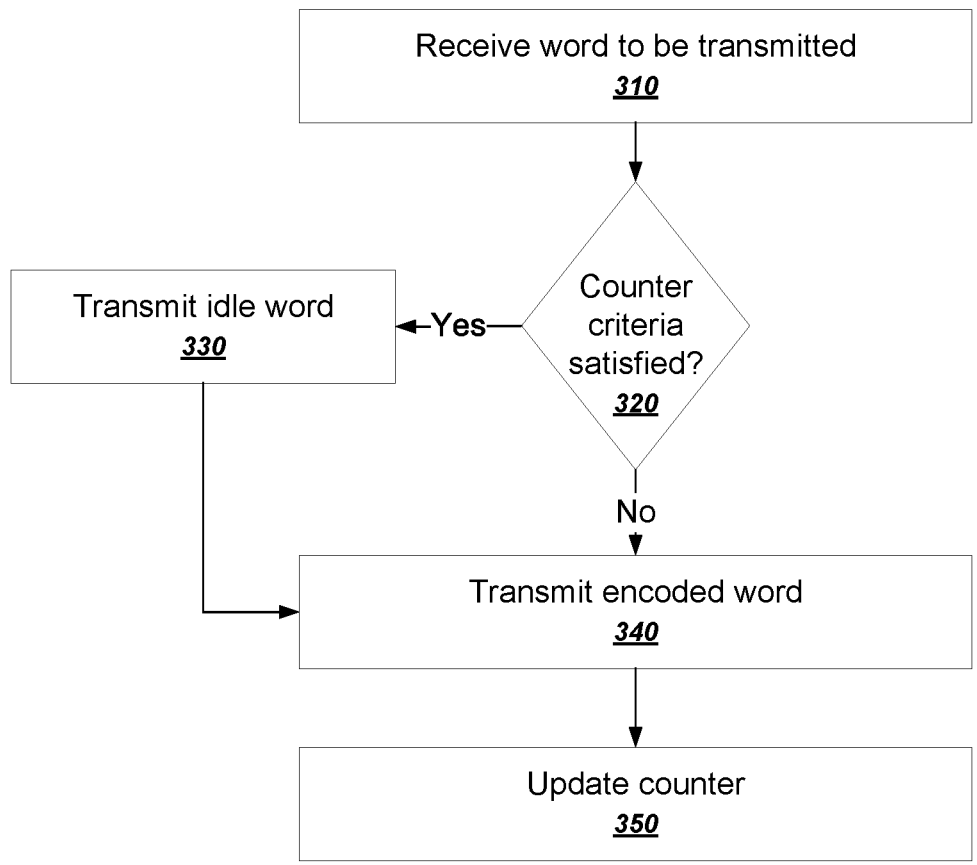
FIG. 3 is a flow chart of an example process for updating a counter.

FIG. 3 is a flow chart of an example process for updating a counter. The process will be described as being performed by a computer system having an appropriately programmed network interface device.

The system receives a word to be transmitted (310). For example, the word can be one of multiple payload words to be transmitted.

The system determines whether one or more counter criteria are satisfied (320). If so, the system transmits an idle word (330) before transmitting the word that was received.

If not, or if the counter criteria was not satisfied, the system transmits the encoded word (340). In other words, the system encodes the word by adding an appropriate sync word, e.g., a data sync word or a control sync word, and transmits the encoded word.

The system updates the counter (350). The system uses statistics from the encoded word to update the counter. For example, the system can count all bits in the encoded word and update the counter accordingly.

Figure 4:
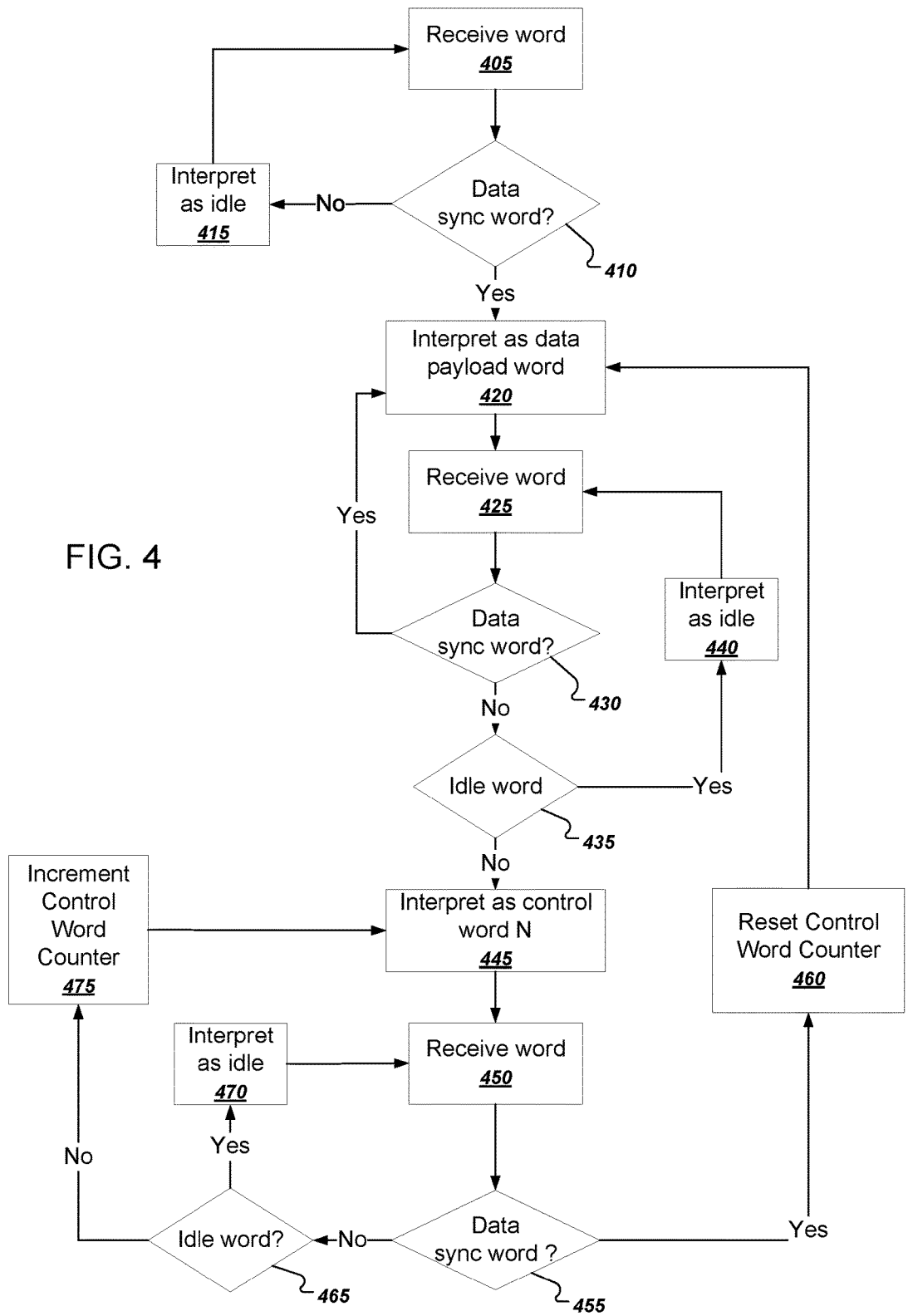
FIG. 4 is a state diagram for a receiving device.

FIG. 4 is a flow chart of an example process for interpreting received words in a frameless packet encoding. The receiving device will use sync word transitions in order to interpret what kind of word has just been received. In general, the receiving device will transition between three states: an idle state, a data payload state, and a control words state. Sync word transitions in the bit stream can cause the receiving device to move to another state. However, normally idle words that are inserted into the bit stream do not affect the state. The example process will be described as being performed by a system having an appropriately programmed network interface device, e.g., as implemented in the PCS sublayer of an Ethernet interface. Upon receiving each word in the bit stream, the system will determine whether or not to transition to another state by performing one or more tests on the most recently received word.

The system receives a word (410). The system initially starts in an idle state during which there are no data packets to send. The MAC layer can send idle control words in the idle state, which the PCS sublayer encodes and processes to maintain the physical layer components. In general, the encoding for idle words includes adding a control sync word rather than a data sync word.

Thus, as long as there is no sync word transition from receiving a data sync word (410), the system interprets each word as an idle word (415). In the idle state, without a sync word transition, the receiving device can actually ignore the contents of the idle words.

If a sync word transition occurs and the system receives a word having a data sync word (410), the system transitions to the data payload state and interprets the received word as a data payload word (420). During the data payload state, the system interprets each received word as a data payload word.

Thus, the system receives a word (425) and determines whether a sync word transition occurs by receiving a word having a control sync word (430). If not, the system continues to interpret the received word as a data payload word (branch to 420).

It's possible that during the data payload state, the transmitting device will insert idle words in between data payload words, e.g., because the transmitting device determined that one or more counter criteria were satisfied. Thus, even if a sync word transition does occur (430), the system still determines whether the word is an idle word (435) before transitioning out of the data payload state. If the word is an idle word (435), the system interprets the received word as an idle word (branch to 440) and remains in the data payload state. In general, the receiving device cannot transition out of the data payload state from an idle word. Rather, the system needs to receive at least one control word, which signals the end of a packet, in order to transition out of the data payload state.

In some implementations, the system interprets invalid control messages as idle words. Thus, if the word is not a data sync word (430), the system may additionally determine whether or not the word is a valid control word. The system can define valid control words to have a minimum distance from other words, including the reserved idle keyword and any valid label of the label and error checking word.

If there is a sync word transition (430) that is not an idle word (435), the system transitions to the control words state and interprets the received word as a control word (branch to 445). During the control words state, the system interprets each received word as a control word, so long as no sync word transition occurs.

The system can interpret the control words according to the order in which they are received. The first control word has a label and an error checking value. Each subsequent control word corresponds to a particular control message being sent by the transmitting device. To determine which control word has just been received, the system can maintain a control word counter. This process is described in more detail below with reference to FIG. 5.

The system receives a word (450) in the control words state. If a sync word transition occurs by receiving a word having a data sync word (455), the system can immediately transition back to the data payload state by resetting the control word counter (branch to 460). In other words, the system need not receive interpacket gaps in order to prepare for the next packet. That is, because the transmitting device is inserting idle words at appropriate places in the bit stream and because PCS delimiters are not being used, the system need not pause with an interpacket gap after every packet is completed.

If no sync word transition occurs (455), and the word is not an idle word (465), the system remains in the control words state and increments a control word counter (branch to 475). Each time that the system remains in the control words state, the system can increment a counter that represents which control word has been received. The system thus interprets the received word as control word N (445), where N represents the value of the control words counter.

If the word is an idle word (465), the system interprets the word as an idle word (branch to 470) and remains in the control words state when it receives the next word (450).

Table 1 below illustrates how a system will interpret each word being received based on the current state of the system and the sync word transitions. In this example, each word is 64 bits, the data sync word is "01," and the control sync word is "10."

TABLE 1

| Word No. | 64 bits data | Sync word | State |
|---|---|---|---|
| 1 | "idle", no packet to send | 10 | Idle |
| 2 | "idle", no packet to send | 10 | Idle |
| 3 | "start of packet", payload bit 0 to 63 | 01 | Data payload |
| 4 | payload bit 64 to 127 | 01 | Data payload |
| 5 | packet label       CRC for payload 0 to 127 | 10 | Control Words |
| 6 | "start of packet", payload bit 0 to 63 | 01 | Data payload |
| 7 | payload bit 64 to 127 | 01 | Data payload |
| 8 | payload bit 128 to 191 | 01 | Data payload |
| 9 | packet label       CRC for payload 0 to 191 | 10 | Control Words |
| 10 | "control message" at first order | 10 | Control Words |

TABLE 1-continued

| Word No. | 64 bits data | Sync word | State |
|---|---|---|---|
| 11 | "control message" at second order | 10 | Control Words |
| 12 | "idle" inserted by PCS | 10 | Control Words |
| 13 | "start of packet", payload bit 0 to 63 | 01 | Data Payload |
| 14 | payload bit 64 to 127 | 01 | Data Payload |
| 15 | "idle" inserted by PCS | 10 | Data Payload |
| 16 | payload bit 128 to 191 | 01 | Data Payload |
| 17 | packet label    CRC for payload 0 to 191 | 10 | Control Words |
| 18 | "control message" at first order | 10 | Control Words |
| 19 | "idle" inserted by PCS | 10 | Control Words |
| 20 | "control message" at second order | 10 | Control Words |

At words 1 and 2, the system receives idle words and thus remains in the idle state.

At word 3, a sync word transition occurs. Thus, the system transitions into the data payload state. Thus, the system interprets words 3 and 4 as data payload words.

At word 5, a sync word transition occurs. Thus, the system transitions to the control words state and interprets word number 5 as the first control word, which is the label and error checking word.

At word 6, a sync word transitions occurs. Thus, the system immediately transitions back into the data payload state, and the system interprets words 6, 7, and 8 as data payload words.

At word 9, a sync word transition occurs. Thus, the system transitions to the control words state and interprets word number 9 as the label and error checking.

At words 10 and 11, no sync word transition occurs. Thus, the system remains in the control words state and interprets words 10 and 11 as control words of the first order and second order respectively.

At word 12, no sync word transition occurs, and the word is an idle inserted by the PCS. Thus, the system remains in the control words state.

At word 13, a sync word transition occurs. Thus, the system transitions back to the data payload state and interprets words 13 and 14 as data payload words.

At word 15, a sync word transition occurs. However, word 15 is an idle word inserted by the PCS. Thus, the system remains in the data payload state and word 16 is interpreted as a data payload word of the same packet as words 13 and 14 rather as than the start of a new packet.

At word 17, a sync word transition occurs, so the system interprets the word as a label and error checking word.

At word 18, no sync word transition occurs, so the system interprets word 18 as a control message of the first order.

At word 19, an idle word occurs, so the system remains in the control words state.

Thus, at word 20 when no sync word transition occurs, the system interprets word 20 as a control message of the second order.

Figure 5:
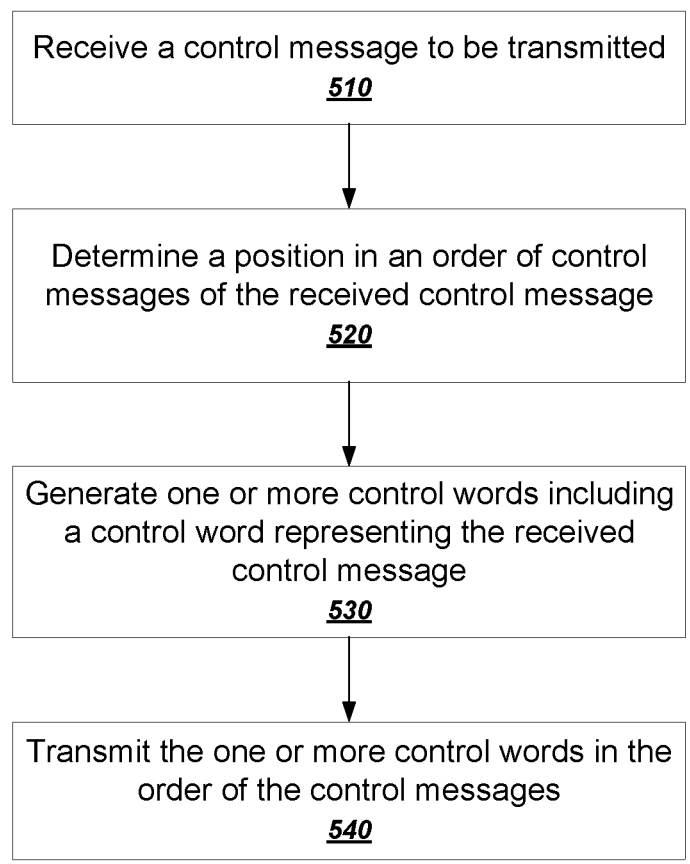
FIG. 5 is a flow chart of an example process for encoding and transmitting control messages.

FIG. 5 is a flow chart of an example process for encoding and transmitting control messages. The receiving device interprets the control words in the order they are received. Thus, the transmitting device has to generate control words in the appropriate order. The process will be described as being performed by a computer system having an appropriately programmed network interface device.

The system receives a control message to be transmitted (510). Typically, the control message comes from a higher layer of the network protocol stack. The control message usually accompanies a data payload to be transmitted. Common control messages include start, terminate, error, idle, and flow control.

The system determines a position, in an order of control messages, of the received control message (520). The system can maintain a specified ordering of control messages and can determine which position corresponds to the received control message.

The system generates one or more control words including a control word representing the received control message (530). If there are unused positions in the ordering of control messages, the system has to insert dummy control words corresponding to the control messages. In other words, if the control message corresponds to the second position, but no control message for the first position is received, the system can generate a dummy control message for the first position. The system can use a reserved value to distinguish dummy control messages from actual control messages. In some implementations, the system generates the control words to have a minimum distance from the reserved idle keyword.

The system transmits the one or more control words in the order of the control messages (540). The system then transmits the generated control words in order. The system may also insert one or more PCS idle words in the ordering of control message, as described above with reference to FIG. 4.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them. The computer storage medium is not, however, a propagated signal.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A computer-implemented method comprising:
   receiving a data payload to be transmitted;
   partitioning the data payload into multiple payload words, each payload word being of a predetermined size;
   adding a first sync word to each of the multiple payload words;
   generating a control word comprising label and an error checking value;
   adding a second sync word to the label and error checking word;
   before transmitting the multiple payload words and the label and error checking word, determining that one or more counter criteria are satisfied for inserting an idle word into a transmission;
   in response to determining that the one or more counter criteria are satisfied, generating an idle word having the second sync word to insert the idle word into a transmission of the multiple payload words and the label error checking word; and
   transmitting, to a destination device, the multiple payload words and the label error checking word, wherein transmitting further comprises transmitting the idle word inserted into the transmission before transmitting the label and error checking word to the destination device.

2. The method of claim 1, wherein transmitting, to the destination device, the multiple payload words comprises transmitting the multiple payload words without generating a media access control header for the data payload.

3. The method of claim 1, wherein transmitting, to the destination device, the multiple payload words comprises transmitting the multiple payload words without generating a start-of-packet or an end-of-packet delimiter for the data payload.

4. The method of claim 1, wherein the idle word has a reserved idle keyword, and wherein generating the label and error checking word comprises generating the label to have at least a minimum Hamming distance from the idle keyword.

5. The method of claim 4, further comprising:
receiving a control message to be transmitted;
determining a position, in an order of control messages, of the received control message;
generating one or more control words including inserting a control word representing the control message at the determined position in the ordering of the control messages, wherein each control word has the second sync word; and
transmitting the one or more control words in the order of the control messages.

6. The method of claim 5, further comprising generating the control messages to be different from the idle keyword.

7. The method of claim 5, wherein each position in the ordering of the control messages represents a different control message.

8. The method of claim 7, wherein generating the one or more control words comprises generating a particular control word corresponding to a particular control message, including generating enough initial control words so that the particular control word occurs, in a sequence of transmitted control words, at a position corresponding to the position in the ordering of control messages.

9. The method of claim 1, wherein determining that one or more counter criteria are satisfied comprises:
maintaining a counter of high or low bits transmitted since a last idle word was transmitted; and
determining that the counter indicates that another idle word should be sent to maintain a particular DC offset.

10. The method of claim 1, wherein transmitting, to the destination device, the idle word comprises transmitting the idle word before transmitting a last payload word of the multiple payload words.

11. The method of claim 1, wherein partitioning the data payload comprises partitioning data in the data payload along word boundaries and padding a last payload word to extend to an end of a last word boundary.

12. A network interface device comprising:
a processor, wherein the processor is programmed to perform the operations comprising:
receiving a data payload to be transmitted;
partitioning the data payload into multiple payload words, each payload word being of a predetermined size;
adding a first sync word to each of the multiple payload words;
generating a control word comprising label and an error checking value;
adding a second sync word to the label and error checking word;
before transmitting the multiple payload words and the label and error checking word, determining that one or more counter criteria are satisfied for inserting an idle word into a transmission;
in response to determining that the one or more counter criteria are satisfied, generating an idle word having the second sync word to insert the idle word into a transmission of the multiple payload words and the label error checking word; and
transmitting, to a destination device, the multiple payload words and the label error checking word, wherein transmitting further comprises transmitting the idle word inserted into the transmission before transmitting the label and error checking word to the destination device.

13. The network interface device of claim 12, wherein transmitting, to the destination device, the multiple payload words comprises transmitting the multiple payload words without generating a media access control header for the data payload.

14. The network interface device of claim 12, wherein transmitting, to the destination device, the multiple payload words comprises transmitting the multiple payload words without generating a start-of-packet or an end-of-packet delimiter for the data payload.

15. The network interface device of claim 12, wherein the idle word has a reserved idle keyword, and wherein generating the label and error checking word comprises generating the label to have at least a minimum Hamming distance from the idle keyword.

16. The network interface device of claim 15, wherein the operations further comprise:
receiving a control message to be transmitted;
determining a position, in an order of control messages, of the received control message;
generating one or more control words including inserting a control word representing the control message at the determined position in the ordering of the control messages, wherein each control word has the second sync word; and
transmitting the one or more control words in the order of the control messages.

17. The network interface device of claim 16, wherein the operations further comprise generating the control messages to be different from the idle keyword.

18. The network interface device of claim 16, wherein each position in the ordering of the control messages represents a different control message.

19. The network interface device of claim 17, wherein generating the one or more control words comprises generating a particular control word corresponding to a particular control message, including generating enough initial control words so that the particular control word occurs, in a sequence of transmitted control words, at a position corresponding to the position in the ordering of control messages.

20. The network interface device of claim 12, wherein determining that one or more counter criteria are satisfied comprises:
maintaining a counter of high or low bits transmitted since a last idle word was transmitted; and
determining that the counter indicates that another idle word should be sent to maintain a particular DC offset.

21. The network interface device of claim 12, wherein transmitting, to the destination device, the idle word comprises transmitting the idle word before transmitting a last payload word of the multiple payload words.

22. The network interface device of claim 12, wherein partitioning the data payload comprises partitioning data in the data payload along word boundaries and padding a last payload word to extend to an end of a last word boundary.

* * * * *